United States Patent
Cervantes et al.

(10) Patent No.: US 6,379,985 B1
(45) Date of Patent: Apr. 30, 2002

(54) METHODS FOR CLEAVING FACETS IN III-V NITRIDES GROWN ON C-FACE SAPPHIRE SUBSTRATES

(75) Inventors: Tanya J. Cervantes, Colorado Springs, CO (US); Linda T. Romano, Sunnyvale; Michael A. Kneissl, Mountain View, both of CA (US)

(73) Assignee: Xerox Corporation, Stamford ( * ) Notice: Subject to any disclaimer, the term of this patent is extended or adjusted under 35 U.S.C. 154(b) by 0 days.

(21) Appl. No.: 09/682,181

(22) Filed: Aug. 1, 2001

(51) Int. Cl.[7] .............................................. H01L 21/301
(52) U.S. Cl. .......................................... 438/33; 438/462
(58) Field of Search ........................... 438/33, 478, 460, 438/462, 483, 973, 974, 975, 977; 257/13, 103, 96; 372/45, 46

(56) References Cited

U.S. PATENT DOCUMENTS

| | | | | |
|---|---|---|---|---|
| 5,777,350 A | * | 7/1998 | Nakmura | 257/96 |
| 5,994,205 A | * | 11/1999 | Yamamoto et al. | 438/464 |
| 6,077,720 A | * | 6/2000 | Yamoka et al. | 438/33 |
| 6,163,557 A | * | 12/2000 | Dunnrowicz et al. | 372/46 |
| 6,197,609 B1 | * | 3/2001 | Tsutsui et al. | 438/22 |
| 6,242,761 B1 | * | 6/2001 | Fuzimoto et al. | 257/94 |
| 6,294,440 B1 | * | 9/2001 | Tsuda et al. | 438/46 |
| 6,294,475 B1 | * | 9/2001 | Schubert et al. | 438/712 |
| 2001/0030318 A1 | * | 10/2001 | Nakamura et al. | 257/13 |

FOREIGN PATENT DOCUMENTS

| JP | 410275955 | * 10/1913 |
| JP | 0927243 | * 10/1997 |
| JP | 410041586 | * 2/1998 |

* cited by examiner

Primary Examiner—Savitri Mulpuri
(74) Attorney, Agent, or Firm—Oliff & Berridge, PLC

(57) ABSTRACT

Methods for cleaving semiconductor structures formed on c-face sapphire substrates are disclosed. An exemplary method includes forming at least one III-V nitride layer on the top c-face of a c-face sapphire substrate. A line of weakness is formed on the bottom c-face of the c-face sapphire substrate in the a-plane direction of the c-face sapphire substrate. A force is applied to the bottom c-face to cleave the c-face sapphire substrate along the line of weakness in the a-plane direction, and to form a cleaved facet along an m-plane of each III-V nitride layer. The III-V nitride layers can be included in laser diodes and other light-emitting devices.

11 Claims, 14 Drawing Sheets

METHODS FOR CLEAVING FACETS IN III-V NITRIDES GROWN ON C-FACE SAPPHIRE SUBSTRATES

BACKGROUND OF INVENTION

1. Field of Invention

This invention is related to semiconductor structures including group III-V nitride films formed on c-face sapphire substrates.

2. Description of Related Art

High-efficiency, solid-state light-emitting devices based on group III-V nitrides ("III-V nitrides") have sufficiently wide bandgaps for short-wavelength, visible light emission. III-V nitrides have been used in light-emitting diode (LED) devices to provide bright green-to-ultraviolet light at high efficiencies. Known LEDs cover all three primary colors of the spectrum (red, green and blue). Accordingly, these devices can be used in various combinations to produce any color.

III-V nitrides have also been used to fabricate diode lasers that operate at room temperature and emit visible light in the blue-violet range under continuous operation. Diode lasers including III-V nitrides can emit coherent radiation and focus light into small spots, enabling high-density optical information storage and printing. Blue lasers are particularly promising due to their short wavelength. In addition, blue lasers can be combined with red and green lasers to create projection displays, color film printers and other devices.

Sapphire is a commonly used substrate material for growing III-V nitride films for light-emitting devices. A-face and c-face single crystal sapphire substrates are most commonly used for growing such III-V nitride films.

SUMMARY OF INVENTION

Diode laser devices include a resonator cavity having opposed mirror surfaces. When electricity passes through the device, photons are produced, which bounce back and forth inside the resonator cavity. The photons move together in phase and at the same wavelength in the resonator cavity, which increases the light intensity. The emitted light forms a narrow column of bright light at a single wavelength, i.e., coherent light.

In order to form diode lasers, facets are formed in the semiconductor structures formed on substrates. The facets form the mirror surfaces of the resonator cavity of the laser diode. It is possible to successfully etch through III-V nitride films formed on sapphire substrates. However, sapphire is difficult to etch. Consequently, portions of the sapphire substrate adjacent to the facets formed in the III-V nitride materials by etching would not be etched through by the etching process, and would interfere with light emitted from the laser diodes. Particularly, the top surface of the sapphire substrate would reflect the emitted light back and create interference fringes in the emitted light pattern. The resulting light emission pattern would not be an acceptable far-field pattern. Accordingly, the laser diodes would be unsuitable for applications that require an acceptable far-field pattern, such as printing applications.

Methods of cleaving sapphire substrates are known. The crystalline structure of sapphire is shown in FIG. 1. The sapphire unit cell 20 has a hexagonal crystal structure. The location and orientation of an a-plane 22, c-planes 24, an m-plane 26 and an r-plane 28 of the sapphire unit cell 20 are shown. The a-plane 22 has a ($1\bar{1}20$) orientation. The c-planes 24 form top and bottom c-faces of the sapphire unit cell 20 and have (0001) orientations. The a-plane 22 is perpendicular to the c-planes 24. The m-planes 26 form side surfaces of the sapphire unit cell 20 and have ($1\bar{1}00$) orientations. The r-plane 28 is oriented at an angle α of 57.6° with respect to the c-planes 24.

The unit cell of GaN, a III-V nitride compound semiconductor, is shown in FIG. 2. The GaN unit cell 30 has a hexagonal crystal structure and includes m-planes 32 forming side faces, and c-planes 34 forming top and bottom c-faces, of the GaN unit cell 30.

Methods for cleaving facets for III-V semiconductor structures grown on a-face sapphire substrates are known. FIG. 3 shows an a-face sapphire substrate 40 including a c-plane flat 42. GaN films grown on a-face sapphire substrates have been cleaved by making a peck on the GaN surface, at an angle of 57.6 degrees with respect to the c-plane flat. A cleave is formed in a direction extending along the r-plane of the sapphire substrate and along an m-plane of GaN, as depicted by line 44.

FIG. 4 is a side view after cleavage of a GaN film 50 formed on the a-face sapphire substrate 40. The cleave is along the ($1\bar{1}02$) r-plane of the a-face sapphire substrate 40 and an m-plane of the GaN film 50.

However, there is a need for methods for forming facets for III-V nitride films grown on c-face sapphire substrates. There is also a need for methods for forming facets for light-emitting devices comprising III-V nitride films grown on c-face sapphire substrates. This invention satisfies these and other needs and provides methods for cleaving facets for III-V nitride films formed on c-face sapphire substrates. This invention separately provides methods for cleaving facets for light-emitting devices comprising such III-V nitride films, formed on c-face sapphire substrates.

This invention also provides light-emitting devices comprising III-V nitride films formed on c-face sapphire substrates.

An exemplary embodiment of the methods for cleaving facets for III-V nitride films according to this invention comprises forming a semiconductor structure comprising at least one III-V nitride layer on the top c-face of a c-face sapphire substrate, which also includes a bottom c-face. A line of weakness is formed on the bottom c-face of the c-face sapphire substrate. The line of weakness extends in the a-plane direction of the c-face sapphire substrate. A force is applied to the bottom c-face to cleave the c-face sapphire substrate along the line of weakness in the a-plane direction, and to form a cleaved facet along an m-plane of each III-V nitride layer.

According to the invention, the semiconductor structures can include laser diodes and light-emitting diodes.

BRIEF DESCRIPTION OF DRAWINGS

Various embodiments of this invention will be described in detail, with reference to the following figures, wherein.

DETAILED DESCRIPTION OF PREFERRED EMBODIMENTS

This invention is directed to methods for forming facets for semiconductor structures grown on c-face sapphire substrates. The semiconductor structures comprise one or more group III-V nitride films ("III-V nitride films").

Embodiments of the semiconductor structures comprise light-emitting devices.

The light-emitting devices can comprise diode lasers, as well as other types of semiconductor light-emitting devices including light-emitting diodes (LEDs).

The III-V nitrides comprise group III and group V elements of the periodic table. The III-V nitrides can be binary compounds, such as GaN, AlN or InN. Additionally, the III-V nitrides can be formed as ternary alloys, such as AlGaN and InGaN, and as quarternary alloys.

The III-V nitrides are advantageous for forming short-wavelength, light-emitting devices. The Al—Ga—In—N system has a large band-gap, which covers the entire visible spectrum. Also, the III-V nitrides have a strong chemical bond, which makes them very stable and resistant to degradation under conditions of high electric current and intense light illumination found in the active regions of lasers. These materials are also resistant to dislocation formation once they have been grown on substrates.

Figure 5:
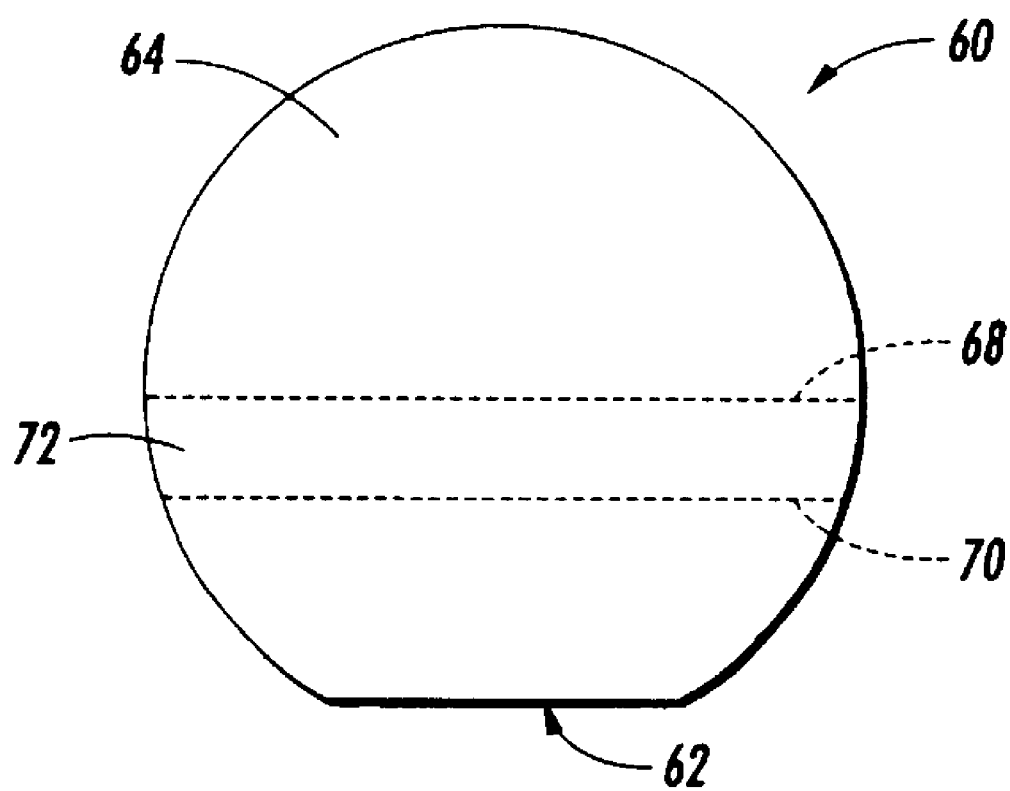
FIG. 5 is a top plan view of a c-face sapphire substrate showing the a-plane and showing the cleavage direction in broken line.
Figure 6:
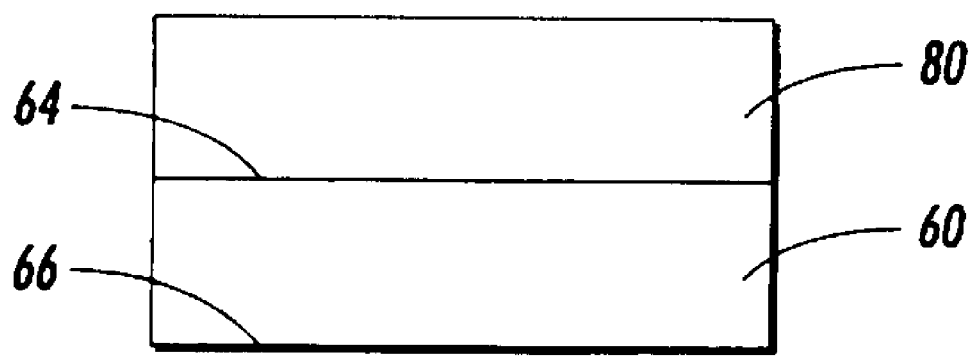
FIG. 6 is a side view showing a break/cleave along the a-plane of the c-face sapphire substrate of FIG. 3 and an m-plane of GaN.

Methods of cleaving facets for III-V nitride films or layers, and also for semiconductor light-emitting devices including III-V nitride films or layers grown on c-face sapphire substrates, according to this invention will be described with reference to FIGS. 5 and 6. FIG. 5 shows a c-face sapphire substrate 60. The c-face sapphire substrate 60 is circular shaped and includes an a-plane face 62. C-face sapphire substrates that are suitable for use in the methods according to this invention are not limited to only such circular shapes. Rather, any suitable c-face sapphire substrate shape, such as rectangular or the like, can optionally be used in embodiments of the methods of this invention.

The c-face sapphire substrate 60 typically has a thickness of from about 100 $\mu$m to about 200 $\mu$m. The c-face sapphire substrate 60 preferably has a thickness of less than about 150 $\mu$m, because reducing the c-face sapphhire substrate thickness generally makes the substrate easier to cleave, as described below.

The c-face sapphire substrate 60 can be thinned by any suitable technique to achieve the desired thickness. For example, the c-face sapphire substrate 60 can be rough polished and then fine polished with a fine grid, such as a 0.1 $\mu$m polish grid, to achieve the desired thickness and also a sufficiently smooth surface on the top c-face 64. The polishing process also ensures that the top c-face 64 and the bottom c-face 66 of the c-face sapphire substrate 60 are sufficiently parallel to each other. The polishing also ensures that the top c-face 64 is at least substantially perpendicular to the a-plane of the c-face sapphire substrate 60.

According to embodiments of the invention, to form facets for III-V nitride films grown on the top c-face 64 of the c-face sapphire substrate 60, the bottom c-face 66 of the c-face sapphire substrate 60 is weakened along a line of weakness 68, that extends along the a-plane direction of the c-face sapphire substrate 60. The line of weakness 68 extends between opposed portions of the edge 72 of the c-face sapphire substrate 60. In FIG. 5, the line of weakness 68 extends along the diameter of the c-face sapphire substrate 68. Another line of weakness 70 is shown that extends parallel to the line of weakness 68 and has a length that is less than the diameter. Other lines of weakness can be formed parallel to the a-plane direction of the c-face sapphire substrate 60 to form additional cleaves, as desired.

In embodiments, the lines of weakness 68, 70 (as well as other lines of weakness that are not shown) extend at least about 95% of the distance between opposed portions of the edge 72 of the c-face sapphire substrate 60. Preferably, the lines of weakness 68, 70 extend the entire distance between opposed portions of the edge 72 of the c-face sapphire substrate 60. By weakening the bottom c-face 66 along the lines of weakness 68, 70 that extend at least substantially the distance between opposed portions of the edge 72 of the c-face sapphire substrate 60, cleavage of the c-face sapphire substrate 60 can be controlled and is reproducible.

As stated, c-face sapphire substrates used in embodiments of this invention can have other shapes than the circular shape shown in FIG. 5. For such other shapes, the bottom c-face of the c-face sapphire substrate is weakened along a line of weakness that extends at least substantially the distance between opposed portions of the edge of the c-face sapphire substrate in the a-plane direction. For example, for a rectangular-shaped c-face sapphire substrate having short sides parallel to the a-plane, lines of weakness can be formed parallel to the short sides, in the width dimension of the c-face sapphire substrate.

The bottom c-face 66 of the c-face sapphire substrate 60 can be weakened by any suitable technique. One suitable technique comprises scribing the bottom c-face 66 along a line in the direction of the a-plane of the c-face sapphire substrate to form a line of weakness. For example, as shown in dotted line in FIG. 5, the bottom c-face can be scribed along a line that defines the diameter of the c-face sapphire substrate to form the line of weakness 68. The line of weakness 68 extends the length of the diameter of the c-face sapphire substrate 60. A suitable tool for forming the scribe line is a Loomis Model LCD-1 Cleaver/Scriber, which is commercially available from Loomis Industries, 1204 Church Street, St. Helena, Calif. 94574. The scribe pressure can range from about 0 psi to about 10 psi, and is preferably from about 4 psi to about 8 psi. The scribing process can be repeated to form any desired number of lines of weakness for cleaving.

Another suitable technique for weakening the bottom c-face 66 of the c-face sapphire substrate 60 in the a-plane direction is laser ablation. Laser ablation can remove material along the a-plane direction to form lines of weakness along which the c-face sapphire substrate can be cleaved. Short-wavelength, pulsed excimer lasers, mode-locked Nd:YAG lasers, or far-infrared $CO_2$ lasers emit an optical beam that can be focused to a small spot size. The laser light is absorbed in the sapphire substrate, which can locally heat and remove material from the sapphire. This process is also known as laser ablation. As the laser pulses are very short (few tens of ns), the heating occurs only locally and does not affect the zone surrounding the ablated region. Suitable operating conditions for the laser ablation process would be understood by those having ordinary skill in the art. To form a narrow groove or trench the laser is focused to a very small spot size, typically in the order of a few microns. The minimum spot size determines the width of the groove. By rastering the focused laser beam along the sapphire, substrate trenches or grooves are formed to create a line of weakness in the substrate. The depth of the groove or trench should have at least the same size as the width, but can be larger than the width. The depth of the trench or groove is typically in the order of several microns or several tens of microns.

In addition, the bottom c-face 66 of the c-face sapphire substrate 60 can be weakened along the a-plane direction by any suitable etching technique. Although, as described above, it is difficult to etch through the entire thickness of the c-face sapphire substrate 60, etching can be used to form shallow grooves, trenches or other like configuration, in the bottom c-face 66 in the a-plane direction, to sufficiently weaken the c-face sapphire substrate 60, so that it can be cleaved along the groove or the like. For example, dry etching techniques, such as $Cl_2/BCl_3$ based reactive ion beam etching (RIE), or chemically assisted ion beam etching (CAIBE) using $Ar/Cl_2/BCl_3$, can be used for this purpose. Such techniques can form grooves or the like in the bottom c-face 66 of the c-face sapphire substrate 60 having a depth of less than about 1 $\mu$m, which is typically sufficient for cleaving the substrate. The width of the trench or the like is defined by a photoresist or metal-mask (e.g., Ni) pattern and is typically in the order of several microns.

Once the bottom c-face 66 of the c-face sapphire substrate 60 has been weakened along one or more lines of weakness, a force is then applied to the bottom c-face 66 along the line(s) of weakness to cleave the c-face sapphire substrate 60 and form a cleaved face that extends along the a-plane direction for each line of weakness, and also to cleave the one or more III-V nitride layer 80 formed on the top c-face 64 an equal number of times. The cleaves are formed along m-planes of the III-V nitride layers 80, which are aligned with the a-plane of the c-face sapphire substrate 60. FIG. 6 shows a break/cleave along the a-plane of the c-face sapphire substrate 60 and along an m-plane of the at least one III-V nitride layer 80 formed on the c-face sapphire substrate 60. When a plurality of III-V nitride layers 80 are formed in a stacked structure on the c-face sapphire substrate 60, cleaved facets are formed that extend along an m-plane of each III-V nitride layer 80. As stated, by repeating the cleaving process, the stacked structure can be cleaved along m-planes a plurality of times.

According to the invention, any suitable technique for applying force to the bottom c-face of the c-face sapphire substrate along the line of weakness can be used. For example, the top c-face 64 of the c-face sapphire substrate 60 can be positioned to face and contact a supporting surface and pressure can be applied to the bottom c-face 66 along a line of weakness. For example, pressure can be applied along the line of weakness 68, 70 using the above-described cleaving and scribing tool. A suitable pressure to cleave the c-face sapphire substrate 60 along the lines of weakness 68, 70 is applied to the bottom c-face 66. For example, the pressure can typically be from about 10 psi to about 20 psi to cause cleavage along the lines of weakness 68, 70.

To enhance cleavage along the lines of weakness, the lines of weakness can be positioned over a sharp edge of a surface that supports the c-face sapphire substrate during cleavage. For example, the c-face sapphire substrate 60 can be positioned to partially overhang the edge of the surface, such that one of the lines of weakness 68, 70 overlies the edge. Pressure can then be applied to the bottom c-face 66 of the c-face sapphire substrate 60 along the line of weakness 68 or 70 to cleave the c-face sapphire substrate.

According to this invention, cleaved facets can be formed in the one or more III-V nitride layer 80 that are grown on the c-face sapphire substrate 60 and are preferably at least substantially perpendicular to the top c-face 64 of c-face sapphire substrate 60. Accordingly, the cleaved facets are at least substantially perpendicular to device structures formed on the top c-face 64. The cleaved facets having this orientation enable laser diodes formed on the c-face sapphire substrate 60 to achieve satisfactory far-field patterns, making the laser diodes suitable for certain applications, such as printing applications or optical storage applications.

Figure 7:
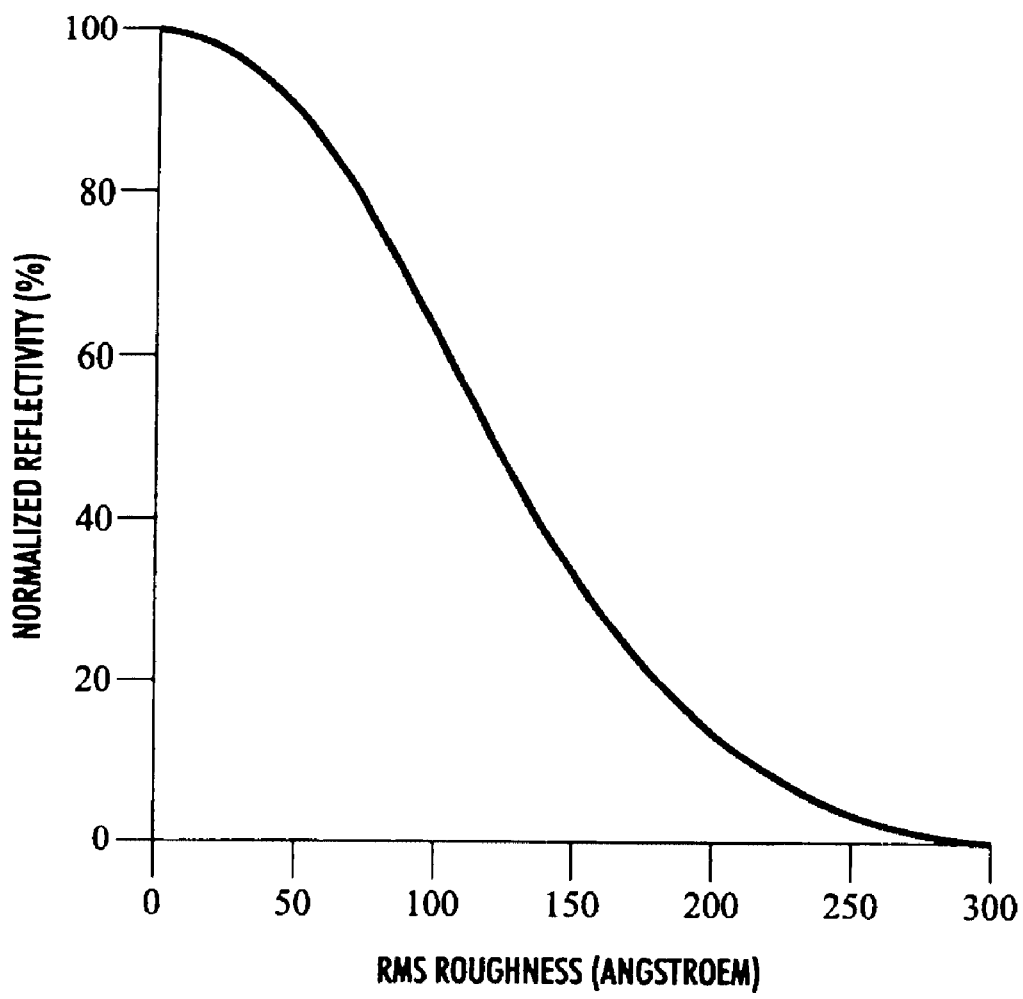
FIG. 7 shows the calculated change in reflectivity for a laser facet versus the rms surface roughness of the laser mirror.
Figure 8:
FIG. 8 shows a height profile along a portion of a cleaved III-V nitride layer formed on a c-face sapphire substrate.
Figure 9:
FIG. 9 shows a height profile along another portion of the cleaved III-V nitride layer of FIG. 8.

Methods according to this invention can form cleaved facets in III-V nitrides formed on c-face sapphire substrates that have an rms (root mean square) roughness of from about 20 Å to about 200 Å, and preferably less than about 100 Å. The reflectivity of the cleaved laser diode facet is reduced depending on the amount of surface roughness on the laser mirror. The calculated reduction in mirror reflectivity for different amounts of (rms) surface roughness is plotted in FIG. 7. As shown in FIG. 7, the normalized mirror reflectivity drops to approximately 60% from the maximum value for a (rms) surface roughness of 100 Å, and to approximately 12% from the maximum value for a (rms) surface roughness of 200 Å. FIG. 8 shows a height profile along a portion of a cleaved GaN layer formed on c-face sapphire. FIG. 9 shows a height profile along another portion of the cleaved GaN layer of FIG. 8. The measured rms roughness for all of the profiles is from about 50 Å to about 85 Å. According to the simulation in FIG. 7, these amounts of surface roughness correspond to a reduction in mirror reflectivity between 10% and 25%. This calculated range is in good agreement with measured values for cleaved mirror facets according to the invention, as determined from cavity length studies. In order to further increase the reflectivity of the mirror facets in spite of the surface roughness, a high reflective dielectric mirror coating, e.g. composed of $TiO_2/SiO_2$ quarter wavelength stacks, can be deposited over the cleaved mirror surface. The $TiO_2/SiO_2$ can be deposited by electron-beam evaporation. A five pair $TiO_2/SiO_2$ mirror stack yields a reflectivity of more than 90%, which more than compensates the reduction in reflectivity due to surface roughness.

The rms roughness for the cleaved facets according to the invention is comparable to rms roughness values that can be achieved by etching techniques, such as chemical assisted ion beam etching (CAIBE). However, as stated above, such etching techniques are not suitable for etching completely through c-face sapphire substrates. Accordingly, methods according to this invention provide important advantages as compared to such etching techniques.

Methods according to this invention can be used to form cleaved facets for large numbers of light-emitting devices on single c-face sapphire substrates. For example, for a two-inch diameter c-face sapphire substrate, thousands of light-emitting devices, such as laser diodes or LEDs, can be formed. For example, light-emitting devices can be formed at a spacing of about 500 $\mu$m from each other on c-face sapphire substrates.

When a scribing technique is used to form lines of weakness on c-face sapphire substrates, the scribing process can be automated to increase process output and efficiency. Etching and laser ablation techniques can also be used to automatically produce large numbers of light-emitting devices on a single c-face sapphire substrate.

Methods according to this invention can be used to form various semiconductor structures that include one or more III-V nitride layers on c-face sapphire substrates. As stated, methods according to this invention are particularly advantageous for forming facets in III-V nitride layers for diode lasers. The facets can be at least substantially perpendicular to the c-face of c-face sapphire substrates, and also have a suitable roughness to enable the laser diodes to emit a satisfactory far-field light pattern for various applications.

FIG. 9 shows an exemplary embodiment of a laser diode 180 formed on a c-face sapphire substrate 160 according to this invention. The laser diode 180 includes, in the following order, a nucleation layer 190, a first III-V nitride layer 200, a second III-V nitride layer 210, a third III-V nitride layer 220, an active region 225, a fourth III-V nitride layer 230, a fifth III-V nitride layer 240, a sixth III-V nitride layer 250, and a seventh III-V nitride layer 260.

The nucleation layer 190 is optional and acts primarily as a wetting layer, to provide smooth, uniform coverage of the top c-face 164 of the c-face sapphire substrate 160. The nucleation layer 190 can comprise any suitable material. Typically, the nucleation layer 190 is formed of a binary or ternary III-V nitride material, such as, for example, GaN, AlN, InGaN or AlGaN. The nucleation layer 190 typically has a thickness of from about 100 Å to about 300 Å. The nucleation layer 190 preferably has a lattice orientation that is substantially aligned to that of the c-face sapphire substrate 160 to promote epitaxial growth of III-V nitride films over the nucleation layer 190.

The nucleation layer 190 can be deposited on the c-face sapphire substrate 160 as a thin amorphous layer. The nucleation layer 190 can be deposited at a low temperature and then be crystallized through a solid-phase epitaxy process, usually coincident with the temperature being raised for the formation of the remainder of the laser diode. However, any other suitable method for forming the nucleation layer can alternatively be used.

The nucleation layer 190 can comprise one layer or multiple layers. For example, in some embodiments, different nucleation layers can be formed having different alloy concentrations, or under different deposition conditions, to promote smooth film growth and accommodate lattice mismatch.

The first III-V nitride layer 200 formed on the nucleation layer 190 typically comprises GaN:Si or AlGaN:Si. The first III-V nitride layer typically has a thickness of from about 1 $\mu$m to about 10 $\mu$m.

The second III-V nitride layer 210 formed over the first III-V nitride layer 200 typically comprises AlGaN:Si with an Al content larger than that of the third III-V nitride layer 220. The second III-V nitride layer 210 typically has a thickness of from about 0.2 $\mu$m to about 2 $\mu$m.

The third III-V nitride layer 220 formed over the second III-V nitride layer 210 acts as a waveguide layer. The third III-V nitride layer 220 typically comprises n-type (In)GaN:Si or undoped (In)GaN having an In content smaller than that of InGaN well(s) forming the active region 225. The thickness of the third III-V nitride layer 220 is typically from about 0.05 $\mu$m to about 0.2 $\mu$m.

The active region 225 typically comprises multiple-quantum wells. The individual quantum wells typically have a thickness of from about 10 Å to about 100 Å and are separated by barriers typically having a thickness of from about 10 Å to about 200 Å. The quantum wells can comprise InGaN or any other suitable material. The barriers can comprise (In)GaN or any other suitable material. The quantum wells and/or the barriers are typically undoped; however, they can be doped with silicon or any other suitable dopant materials.

The fourth III-V nitride layer 230 formed over the active region 225 acts as a carrier confinement layer. The fourth III-V nitride layer 230 has a higher band gap than the active region 225. The fourth III-V nitride layer 230 typically comprises p-type $Al_xGa_{1-x}N$:Mg with an Al content ranging from x=0.05 to x=0.3. The thickness of the fourth III-V nitride layer 230 is typically from about 0.005 $\mu$m to about 0.1 $\mu$m.

The fifth III-V nitride layer 240 formed over the fourth III-V nitride layer 230 acts as a waveguide layer. The fifth III-V nitride layer 240 typically comprises p-type (In)GaN:Mg with an In content smaller than that of the InGaN multi-quantum well(s) in the active region 225. The fifth III-V nitride layer 240 has a typical thickness of from about 0.05 $\mu$m to about 0.2 $\mu$m.

As stated above, the sixth III-V nitride layer 250 is formed over the fifth III-V nitride layer 240. The sixth III-V nitride layer 250 serves as a p-type cladding layer. The sixth III-V nitride layer 250 typically comprises AlGaN:Mg having an Al content larger than the third III-V nitride layer 220. The sixth III-V nitride layer 250 typically has a thickness of from about 0.2 $\mu$m to about 1 $\mu$m.

The seventh III-V nitride layer 260 formed over the sixth III-V nitride layer 250 typically comprises GaN:Mg. The seventh III-V nitride layer 260 forms a contact layer for a minimum-resistance metal electrode, to contact the p-side of the heterostructure. The seventh III-V nitride layer 260 typically has a thickness of from about 0.01 $\mu$m to about 0.2 $\mu$m.

In this exemplary embodiment, both of the respective sixth and seventh III-V nitride layers 250, 260 are p-type doped.

Each of the III-V nitride layers of the laser diode 180, as well as the nucleation layer 190, can be formed of any suitable III-V nitride material and are not limited to the above-described exemplary materials.

The second, and sixth III-V nitride layers, 210, 250, respectively, provide optical and electrical confinement. These layers have a higher bandgap energy and lower refractive index, as compared with the third III-V nitride layer 220.

After cleaving of the facets by the above-described technique, a high-reflective coating comprising a suitable material, such as $SiO_2/TiO_2$, $SiO_2/Ta_2O_5$, $SiO_2/HfO_2$ or the like, can be deposited on the backside of laser diode facets using e-beam evaporation or other suitable technique, and/or a SiO or $SiO_2$ anti-reflective coating can be deposited on the front side of the laser diode facet using e-beam evaporation or other suitable technique.

Figure 1:
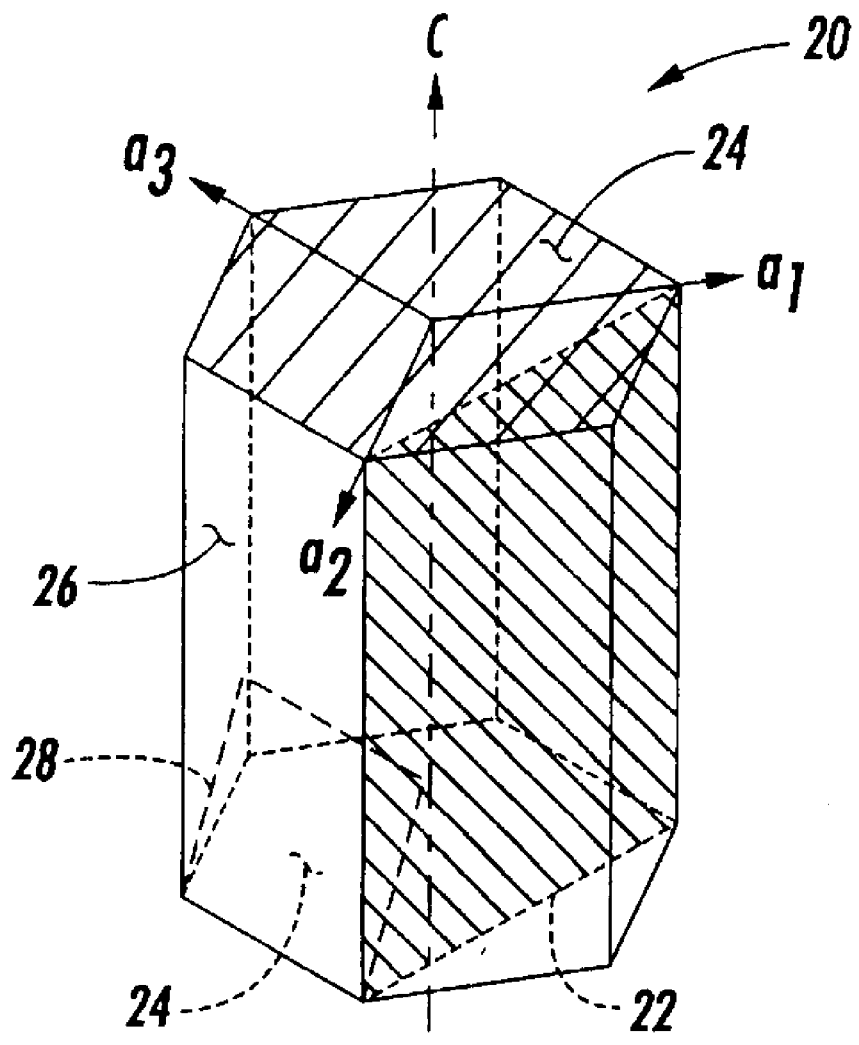
FIG. 1 illustrates the crystalline structure of sapphire.
Figure 2:
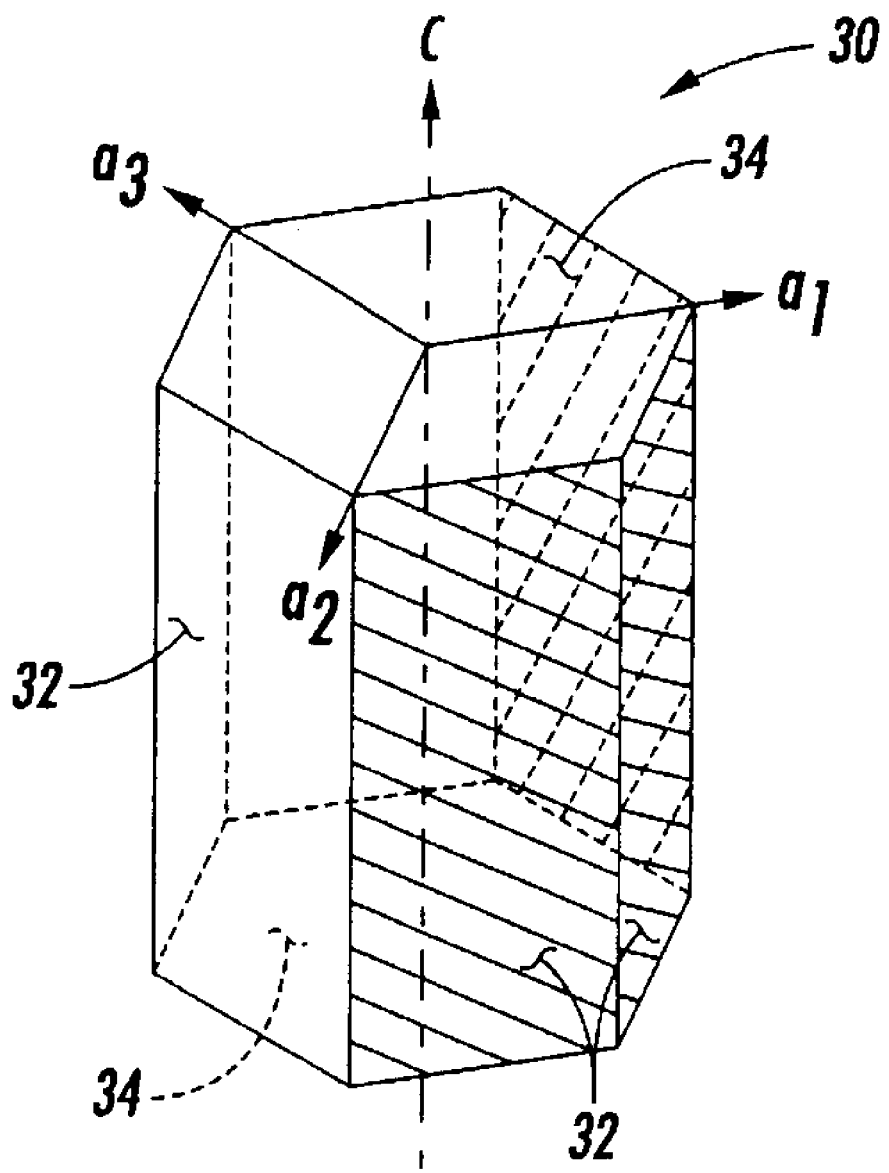
FIG. 2 illustrates the crystalline structure of GaN.
Figure 3:
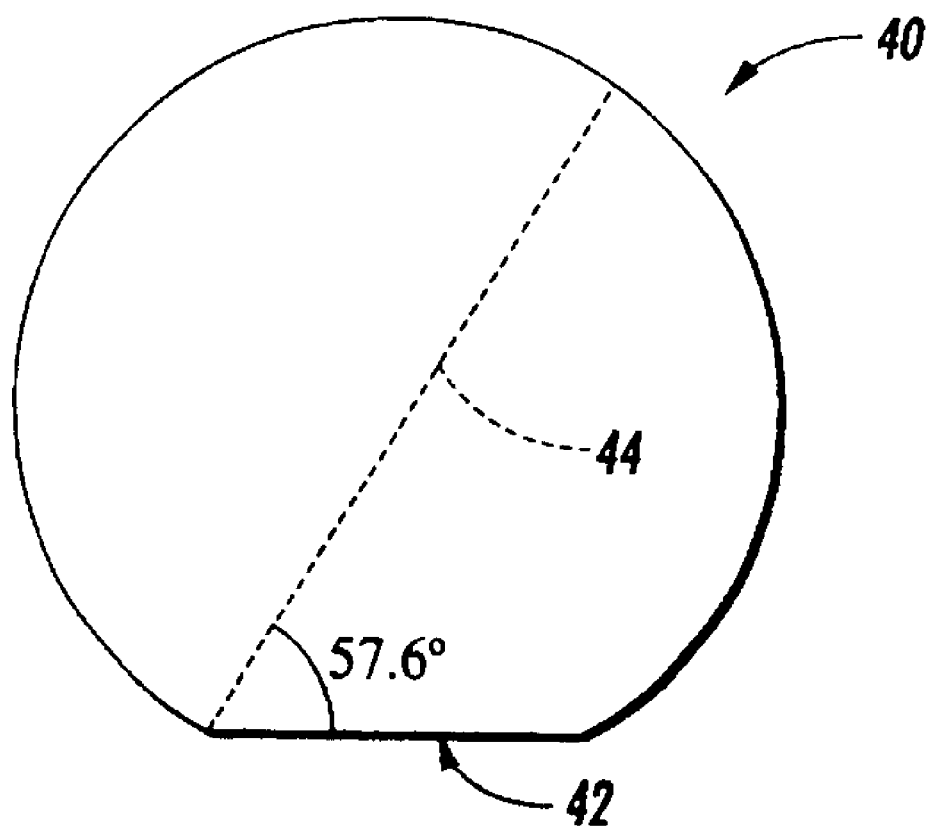
FIG. 3 is a top plan view of an a-face sapphire substrate showing the c-plane and showing the cleavage direction in broken line.
Figure 4:
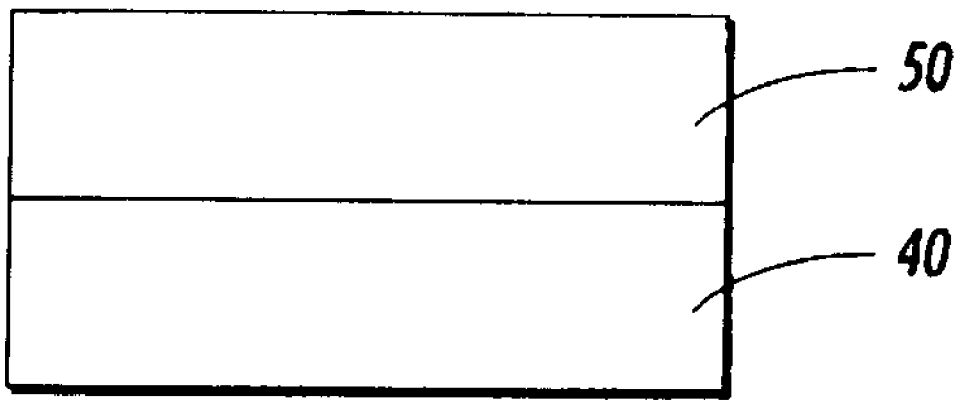
FIG. 4 is a side view showing a cleave along the r-plane of the a-face sapphire substrate of FIG. 3 and an m-plane of GaN.

The semiconductor structure shown in FIG. 9 can be deposited on the c-face sapphire 160 by a suitable technique. For example, metalorganic chemical vapor deposition (MOCVD) can be used to form the semiconductor structure. The deposition process is typically performed on 2-inch or 3-inch diameter c-face sapphire substrate wafer (i.e., (0001) oriented) having an a-plane flat, as depicted in FIG. 3. The sapphire substrate is c-face The c-face sapphire substrate can have standard specifications, including an epitaxial polish on one side (i.e., the top c-face 164) and a typical thickness of from about 10 mils to about 17 mils.

The temperature of the c-face sapphire substrate 160 during growth of the semiconductor structure is typically about 550° C. for a GaN nucleation layer 190, from about 1000° C. to about 1100° C. for GaN and AlGaN layers (i.e., III-V nitride layers 200, 210, 220, 230, 240, 250 and 260), and from about 700° C. to about 800° C. for the InGaN layers forming the active region 225. In addition, the reactor pressure for deposition can be controlled to from about 50 Torr to about 740 Torr.

Suitable exemplary organometallic precursors for the MOCVD growth include TMGa, TMAl, TMIn and TEGa for the group III elements, and $NH_3$ can be used as the nitrogen source. For the n-doping (Si) of the first, second and third III-V nitride layers 200, 210 and 220, respectively, 100 ppm $SiH_4$ diluted in $H_2$ can be used, for example. For p-doping of the fourth, fifth, sixth and seventh III-V nitride layers 230, 240, 250 and 260, $Cp_2Mg$, for example, can be used. Hydrogen and/or nitrogen can be used as carrier gas for the metalorganic sources.

Figure 10:
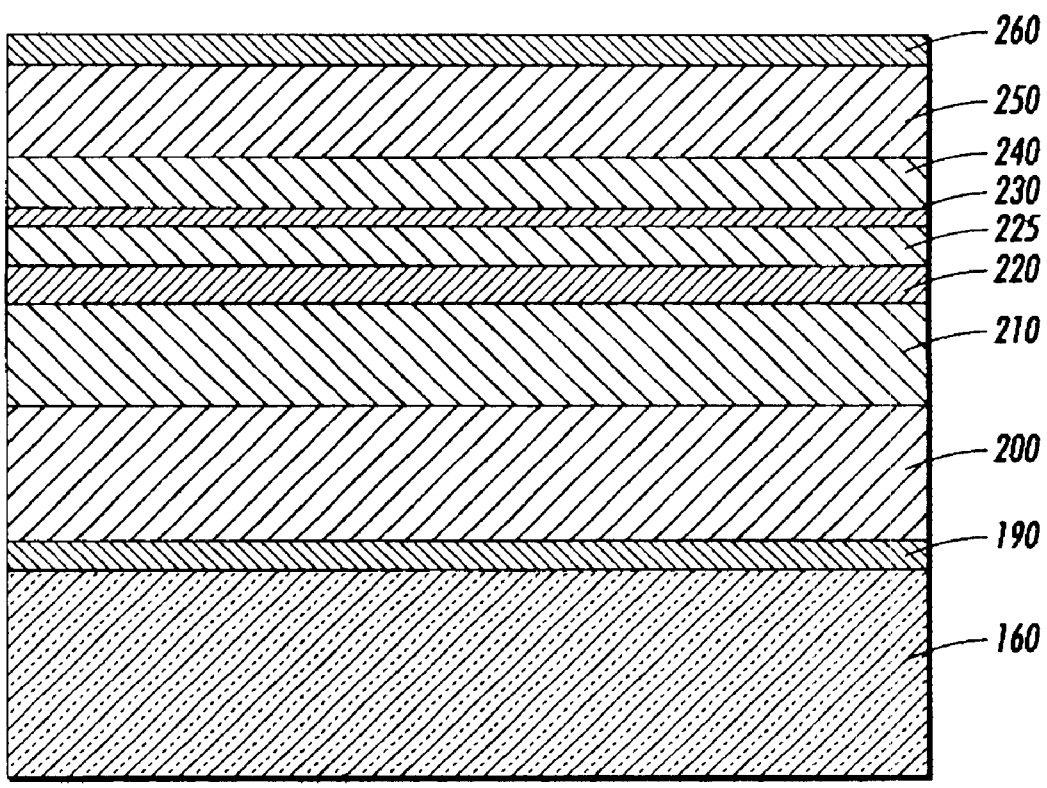
FIG. 10 illustrates an exemplary embodiment of a layered structure comprising III-V nitride layers formed on a c-face sapphire substrate according to the invention.

After MOCVD growth, the wafer is taken out of the growth reactor, additional process steps are typically then performed. With reference to FIG. 10, first, the Mg p-doping in (Al)GaN:Mg-containing layers is activated by a suitable technique, such as by rapid thermal annealing (RTA) at about 850° C. for about 5 minutes in an $N_2$ ambient. Next, p-metal (Ni/Au or Pd or Pt) is deposited by thermal evaporation and rapid thermal annealing in an $N_2$ ambient at about 500° C. Dry etching is then performed using chemical assisted ion beam etching (CAIBE), reactive ion beam etching (RIE), or any other suitable technique, to form a ridge waveguide in an $Ar/Cl_2/BCl_3$ gas mixture. Next, dry etching is performed using CAIBE, RIE, or any other suitable technique, to form isolation trenches and to etch down to the first III-V nitride layer 200 in $Ar/Cl_2/BCl_3$ gas mixture.

Dielectric deposition of a suitable dielectric material, such as silicon-oxy-nitride, $SiO_2$ or $Si_3N_4$, is performed using plasma-enhanced chemical vapor deposition (PE-CVD), or any other suitable technique. Alternatively, other materials, such as polyimid, can be used for isolation.

Contact windows in the dielectric are opened using RF plasma etching in $CF_4/O_2$ ambient.

P-electrodes 270 are formed over the seventh III-V nitride layer 260. The p-electrodes are typically deposited by thermal evaporation. The p-electrodes, can comprise, for example, Ti/Au or Ti/Pt/Au.

N-electrodes 280 are formed over the first III-V nitride layer 200. The n-electrodes are typically deposited by thermal evaporation. The n-electrodes can comprise, for example, Ti/Al or Ti/Au. The n-electrodes are typically annealed by rapid thermal annealing in $N_2$ ambient at a temperature of about 500° C.

FIG. 10 shows separately addressable laser diodes 180 integrated on a single c-face sapphire substrate 160 and a p-electrode 270 and an n-electrode 280 in contact with the laser diodes 180.

The p-electrodes 270 and n-electrodes 280 can be pre-patterned on the c-face sapphire substrate 160 to prevent metal forming the electrodes 270, 280 from hanging over the cleaved edges of the laser diodes 180, which can result in a short-circuit of laser diodes, and therefore failure. The spacing between the electrodes of adjacent laser diodes can be optimized such that the spacing is sufficiently large to facilitate cleaving. However, the electrode spacing should not be too large, because all portions of the laser diode that are not covered with metal electrodes are basically unpumped (i.e., little or no current goes into those portions), which results in an increase in threshold current. This increase is not a problem, as long as the size of the unpumped region of the laser diode is small compared to the cavity length.

Figure 11:
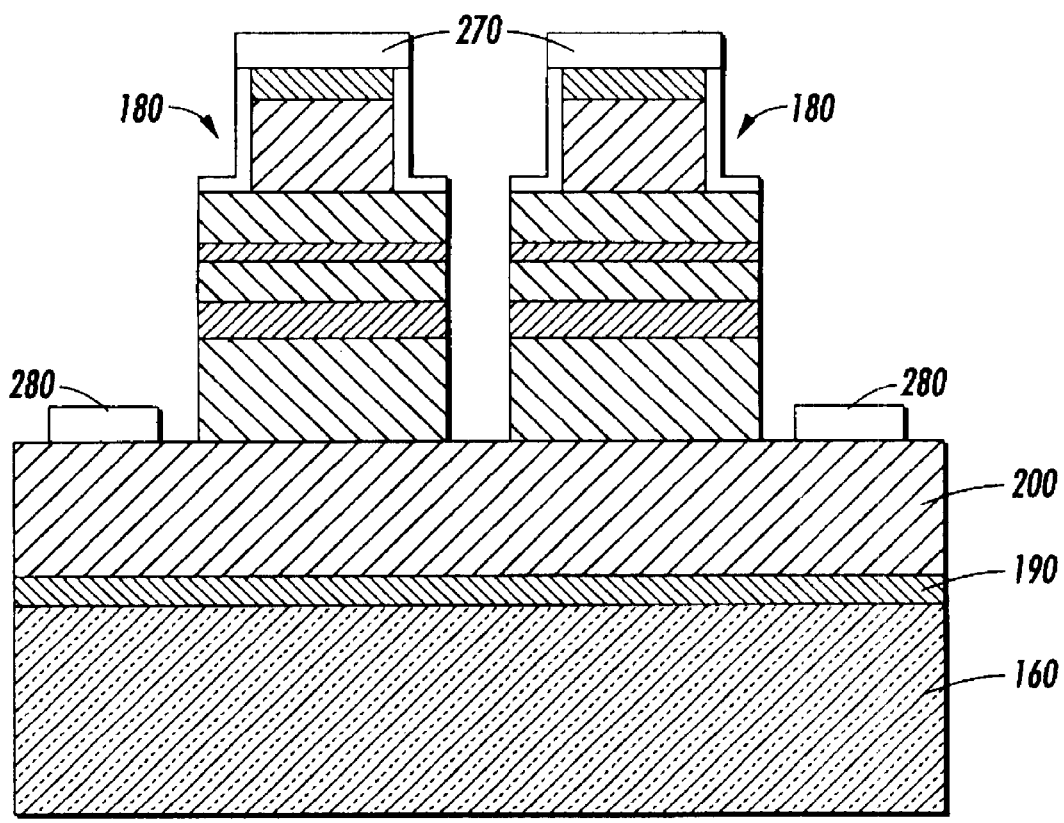
FIG. 11 illustrates an exemplary embodiment of a III-V nitride-based semiconductor laser device according to the invention.

FIG. 11 shows a group-III nitride-based semiconductor laser chip with several laser diodes 180 and separate p-electrodes 270 and n-electrodes 280. This configuration can avoid short circuits after cleaving facets. The dotted lines C indicate areas between the laser diodes 180 without metal electrodes, where the facets can be cleaved. As shown respective p-electrodes 270 and n-electrodes 280 of devices on opposite sides of the dotted line C are separated from each other by a gap G. The gap G between the electrodes is typically between about 5 µm and 200 µm. The gap can be selected based on the cavity length of the laser device. For example, the gap G can be a minimum of about 5 µm and a maximum of about 30 µm for a 300 µm cavity device; a maximum of about 60 µm for a 500 µm cavity device, or a maximum of about 100 µm for a 750 µm cavity device.

Figure 12:
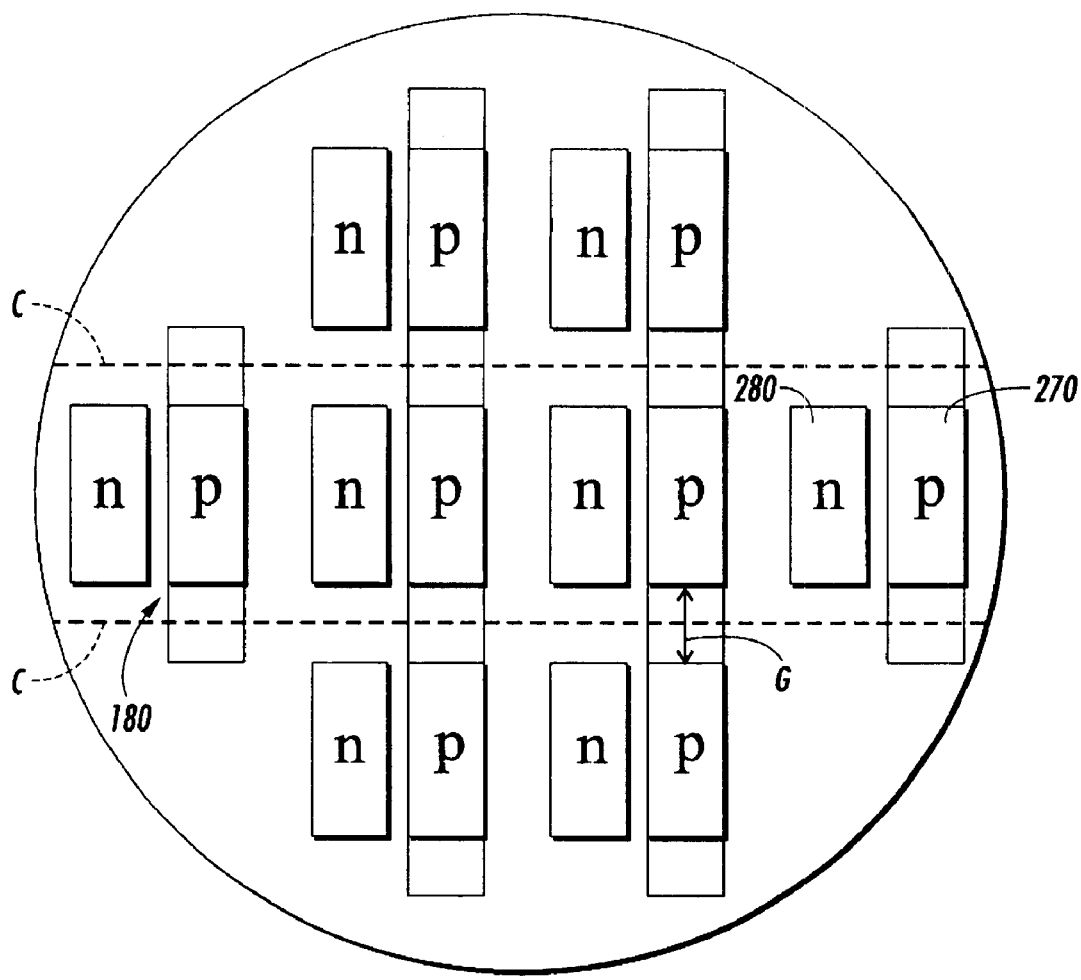
FIG. 12 is a top plan view of a III-V nitride-based semiconductor laser chip including several laser devices and separate n-electrodes and p-electrodes.

FIG. 12 shows the relative increase in threshold current density for laser diodes with different cavity lengths of 300 µm, 500 µm and 750 µm and varying lengths of the unpumped portion of the laser diodes. For reasonable device performance, the increase in threshold current should be typically less than about 10%.

Figure 13:
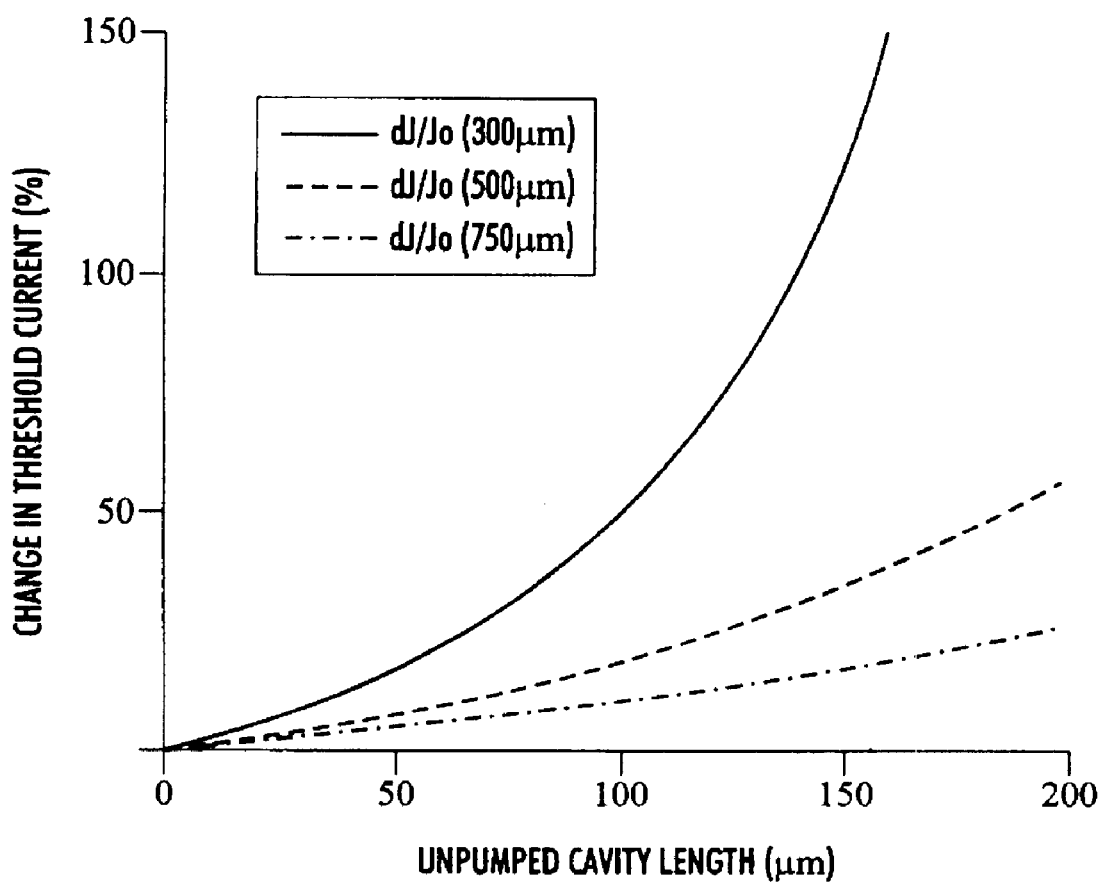
FIG. 13 is a plot of change in threshold current versus unpumped cavity length for laser devices with different cavity lengths.
Figure 14:
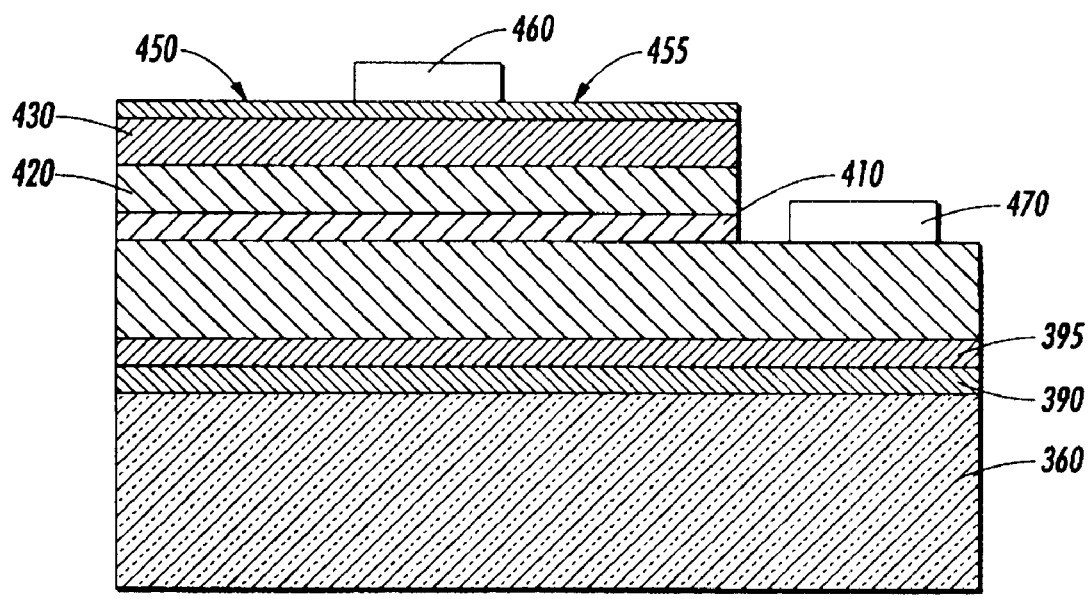
FIG. 14 illustrates an exemplary embodiment of a light emitting diode according to the invention.

Although LEDs do not include opposed mirror surfaces forming a resonator cavity as in the above-described laser diodes, methods according to this invention can be used to form facets for III-V nitrides of LED structures formed on c-face sapphire substrates. FIG. 13 shows an exemplary embodiment of a multi-layer LED 380 formed on a c-face sapphire substrate 360 according to this invention. The LED 380 includes two buffer layers 390, 395 having the same function as the buffer layer 190 of the laser diode 180 shown in FIG. 9. The buffer layers 390, 395 can also comprise the same materials and have the same thickness as the buffer layer 190.

The LED 380 comprises a first III-V nitride layer 400 deposited over the upper buffer layer 395. The first III-V nitride layer 400 can be doped with any suitable dopant material, such as an n-type dopant. The first III-V nitride layer 400 is typically grown to a thickness from about 1 µm to about 10 µm.

A second III-V nitride layer 410 is formed over the first III-V nitride layer 400. The second III-V nitride layer 410 functions as an active layer in the LED 380. The second III-V layer 410 can produce blue, green, yellow or red light, depending on its composition. The second III-V nitride layer 410 can typically have a thickness of from about 10 Å to about 100 Å.

A third III-V nitride layer 420 is formed over the second III-V nitride layer 410. A fourth III-V nitride layer 430 is formed over the third III-V nitride layer 420. In this exemplary embodiment, the third III-V nitride layer 420 and the fourth III-V nitride layer 430 are p-type doped. III-V nitride materials used for the third and fourth III-V nitride layers 420, 430, respectively, can include, for example, GaN, InGaN, AlGaN, AlInGaN and the like. The third III-V nitride layer 420 typically has a higher bandgap energy than the fourth III-V nitride layer 430, to enhance confinement of injected electrons to the active region of the LED 380.

A p-electrode 450 is formed over the fourth III-V nitride layer 430. The p-electrode typically comprises a thin, semi-transparent, current-spreading metal layer 455 (e.g., 25 Å of Ni followed by 25 Å of Au) covering the entire fourth III-V nitride layer 430. The p-contact pad 460 is formed on top of the metal layer 455. The p-contact pad 460 typically comprises from about 100 Å to about 1000 Å of Ti, followed by from about 500 Å to about 5000 Å of Au. Other suitable materials can also be used to form the p-contact pad 460.

The fourth III-V nitride layer 430 acts as a contact layer, and so is preferably highly p-type doped.

An n-electrode 470 is formed over the first III-V nitride layer 400.

The buffers layers 390, 395, as well as the III-V nitride layers can be formed by any suitable technique. For example, molecular beam epitaxy, hydride vapor phase epitaxy or metal organic chemical vapor deposition can be used.

As known in the art, multiple confinement and contact layers can optionally be provided within the LED structure.

The laser diode 180 according to the invention can be applied to any device requiring compact laser structures, including imaging devices, such as high resolution laser printing devices and digital printers; display devices, such as projection displays; high density optical storage devices, including magneto-optical storage devices, including CD-ROM and DVDs whereby data is stored on a magneto-optical disk; and fiber-optic communications devices, including fiber optic emitters and repeaters and undersea communications devices (sea water is most transparent in the blue-green spectrum).

The LED 380 according to the invention can also be applied to any device requiring compact LED structures, including illumination devices, full color displays, and monolithically integrated pixels for full color displays.

While the invention has been described in conjunction with the specific embodiments described above, it is evident that many alternatives, modifications and variations are apparent to those skilled in the art. Accordingly, embodiments of the invention as set forth above are intended to be illustrative and not limiting. Various changes can be made without departing from the spirit and scope of the invention.

What is claimed is:

1. A method for cleaving at least one III-V nitride layer of a semiconductor structure formed on a c-face sapphire substrate, comprising:

forming a semiconductor structure comprising at least one III-V nitride layer on a top c-face of a c-face sapphire substrate, the c-face sapphire substrate including a bottom c-face and an edge between the top c-face and bottom c-face;

forming a line of weakness on the bottom c-face of the c-face sapphire substrate along at least substantially the length of a line that (i) extends in an a-plane direction of the c-face sapphire substrate and (ii) extends from one portion of the edge of the c-face sapphire substrate to another portion of the edge; and applying a force to the bottom c-face of the c-face sapphire substrate to cleave the c-face sapphire substrate along the line of weakness in the a-plane direction and to form a cleaved facet along an m-plane of the at least one III-V nitride layer.

2. The method of claim 1, wherein the cleaved facet formed in the at least one III-V nitride layer is substantially perpendicular to the top c-face of the c-face sapphire substrate.

3. The method of claim 1, wherein the c-face sapphire substrate has a thickness of less than about 250 microns.

4. The method of claim 1, wherein the c-face sapphire substrate has a generally circular configuration and a diameter, and forming the line of weakness comprises weakening the bottom c-face of the c-face sapphire substrate along substantially the entire diameter in the a-plane direction of the c-face sapphire substrate.

5. The method of claim 1, wherein the line of weakness if formed by scribing the bottom c-face of the c-face sapphire substrate in the a-plane direction of the c-face sapphire substrate.

6. The method of claim 1, wherein the line of weakness is formed by ablating the bottom c-face of the c-face sapphire substrate in the a-plane direction of the c-face sapphire substrate by laser ablation.

7. The method of claim 1, wherein the line of weakness is formed by etching the bottom c-face of the c-face sapphire substrate in the a-plane direction of the c-face sapphire substrate.

8. The method of claim 1, wherein the line of weakness is formed along the entire length of the line on the bottom c-face of the c-face sapphire substrate in the a-plane direction of the c-face sapphire substrate.

9. The method of claim 1, wherein the cleaved facet of the at least one III-V nitride layer has an rms roughness of less than about 200 Å.

10. The method of claim 1, wherein the at least one semiconductor structure comprises at least one diode laser.

11. The method of claim 1, wherein the at least one semiconductor structure comprises at least one light-emitting diode.

* * * * *